(12) United States Patent
Kim et al.

(10) Patent No.: US 7,710,794 B2
(45) Date of Patent: May 4, 2010

(54) SEMICONDUCTOR MEMORY DEVICE

(75) Inventors: Kyung-Hoon Kim, Kyoungki-do (KR);
Sang-Yeon Byeon, Kyoungki-do (KR);
Chang-Kyu Choi, Kyoungki-do (KR)

(73) Assignee: Hynix Semiconductor, Inc.,
Kyoungki-Do (KR)

( * ) Notice: Subject to any disclaimer, the term of this patent is extended or adjusted under 35 U.S.C. 154(b) by 108 days.

(21) Appl. No.: 12/215,738

(22) Filed: Jun. 30, 2008

(65) Prior Publication Data
US 2009/0116302 A1    May 7, 2009

(30) Foreign Application Priority Data
Nov. 2, 2007    (KR) .................... 10-2007-0111494

(51) Int. Cl.
*G11C 7/22*    (2006.01)
(52) U.S. Cl. ............... 365/189.07; 365/191; 365/193; 365/194
(58) Field of Classification Search ............. 365/191, 365/193, 194, 189.07
See application file for complete search history.

(56) References Cited

U.S. PATENT DOCUMENTS
2008/0157837 A1*    7/2008    Na ......................... 327/158

FOREIGN PATENT DOCUMENTS
KR    2005-0082637    8/2005
KR    2007-0036549    4/2007

* cited by examiner

*Primary Examiner*—Hoai V Ho
*Assistant Examiner*—Jay Radke
(74) *Attorney, Agent, or Firm*—Blakely, Sokoloff, Taylor & Zafman LLP

(57) ABSTRACT

A semiconductor memory device can a desired internal clock in consideration of a delay time of an actual clock/data path. The semiconductor memory device includes a multiclock signal generating unit configured to receive a reference clock signal and generate a plurality of clock signals having a constant phase difference from each other, a delay modeling unit configured to generate a plurality of delay clock signals by reflecting a delay time of an actual clock/data path to the plurality of clock signals, a selection signal generating unit configured to generate selection signals by comparing phases between the reference clock signal and the plurality of delay clock signals, and a phase multiplexing unit configured to output any one of the plurality of clock signals as a final clock signal in response to the selection signals.

26 Claims, 5 Drawing Sheets

SEMICONDUCTOR MEMORY DEVICE

CROSS-REFERENCE(S) TO RELATED APPLICATIONS

The present invention claims priority of Korean patent application number 10-2007-0111494, filed on Nov. 2, 2007, which is incorporated by reference in its entirety.

BACKGROUND OF THE INVENTION

The present invention relates to a semiconductor memory device, and more particularly to a semiconductor memory device which receives an external clock to generate an internal clock.

In general, semiconductor memory devices including double data rate synchronous dynamic random access memory (DDR SDRAM) receive external clock signals to generate internal clock signals. These generated internal clock signals are inputted into various circuits in a semiconductor memory device and used to operate such circuits. In order to compensate for a clock skew of an external clock signal and an internal clock signal, a semiconductor memory device is provided therein with a clock synchronous circuit. Representative examples of clock synchronous circuits include phase locked loop (PLL) circuits and delay locked loop (DLL) circuits.

In recent years, as the operation frequency of semiconductor memory devices is increased up to a high frequency band more than GHz, a PLL circuit, which is easy to generate multi-clock signals and has a frequency multiplication function, is widely used as a clock synchronizing circuit.

FIG. 1 is a block diagram illustrating a conventional clock synchronizing circuit.

Referring to FIG. 1, the clock synchronizing circuit includes a buffering unit 110, a PLL 130, and a phase mixing unit 150.

The buffering unit 110 buffers an external clock signal CLK_EXT to generate a reference clock signal CLK_REF.

The PLL 130 receives the reference clock signal CLK_REF to generate a plurality of clock signals CLK_PLL0, CLK_PLL90, CLK_PLL180 and CLK_PLL270. The plurality of clock signals CLK_PLL0, CLK_PLL90, CLK_PLL180 and CLK_PLL270 are signals having a constant phase difference from each other. In more detail, the plurality of clock signals CLK_PLL0, CLK_PLL90, CLK_PLL180 and CLK_PLL270 include a first clock signal CLK_PLL0, a second clock signal CLK_PLL90 having a phase difference of 90° from the first clock signal CLK_PLL0, a third clock signal CLK_PLL180 having a phase difference of 180° from the first clock signal CLK_PLL0, and a fourth clock signal CLK_PLL270 having a phase difference of 270° from the first clock signal CLK_PLL0.

The phase mixing unit 150 receives and mixes the first to fourth clock signals CLK_PLL0, CLK_PLL90, CLK_PLL180 and CLK_PLL270 to generate a desired internal clock CLK_INT. The generated internal clock CLK_INT passes through an actual clock/data path and is used to output data. As a result, data can be synchronized with the external clock CLK_EXT.

The concrete circuit constructions of the buffering unit 110, the PLL 130 and the phase mixing unit 150 are well known to those skilled in the art, and accordingly their detailed descriptions will be omitted.

As aforementioned, the phase mixing unit 150 mixes the plurality of clock signals CLK_PLL0, CLK_PLL90, CLK_PLL180 and CLK_PLL270 to generate the internal clock CLK_INT. The phase mixing unit 150 often uses a DLL. When the phase mixing unit 150 uses a DLL, the internal clock CLK_INT is generated by using any selected from the plurality of clock signals CLK_PLL0, CLK_PLL90, CLK_PLL180 and CLK_PLL270.

With products produced recently being gradually miniaturized, there is a need to improve a circuit occupying a relatively large area, such as the phase mixing unit 150. In the case that the phase mixing unit 150 uses the DLL, there is a need for improvement of a large area. In particular, since the DLL generates an additional delay time due to a locking operation, there is also needed an improvement for a faster operation of the circuit.

SUMMARY OF THE INVENTION

Embodiments of the present invention are directed to providing a semiconductor memory device for generating a desired internal clock in consideration of a delay time of an actual clock/data path. Therefore, the semiconductor memory device can generate an internal clock with an optimal delay time.

In accordance with an aspect of the present invention, there is provided a semiconductor memory device, which includes a multiclock signal generating unit configured to receive a reference clock signal and generate a plurality of clock signals having a constant phase difference from each other, a delay modeling unit configured to generate a plurality of delay clock signals by delaying the plurality of clock signals, a selection signal generating unit configured to generate selection signals by comparing phases between the reference clock signal and the plurality of delay clock signals, and a phase multiplexing unit configured to output any one of the plurality of clock signals as a final clock signal in response to the selection signals.

In accordance with an aspect of the present invention, there is provided a semiconductor memory device, which includes a multiclock signal generating unit configured to receive a reference clock signal and generate a plurality of clock signals having a constant phase difference from each other, a phase multiplexing unit configured to select any one of the plurality of clock signals in response to selection signals and output the selected clock signal as a final clock signal, a delay modeling unit configured to generate a delay clock signal by delaying the final clock signal, and a selection signal generating unit configured to compare the delay clock signal with a previous delay clock signal and generate the selection signals.

In accordance with an aspect of the present invention, there is provided a semiconductor memory device, which includes a multiclock signal generating unit configured to receive a reference clock signal and generate a plurality of clock signals having a constant phase difference from each other, and a phase multiplexing unit configured to generate selection signals according to a phase relationship between a reference clock signals and a plurality of delay clock signals, which generated by reflecting a delay time of an actual clock/data path to the plurality of clock signals, and output any one of the plurality of clock signals as a final clock signal in response to the selection signals.

DESCRIPTION OF SPECIFIC EMBODIMENTS

Hereinafter, a semiconductor memory device in accordance with the present invention will be described in detail with reference to the accompanying drawings.

Figure 1:
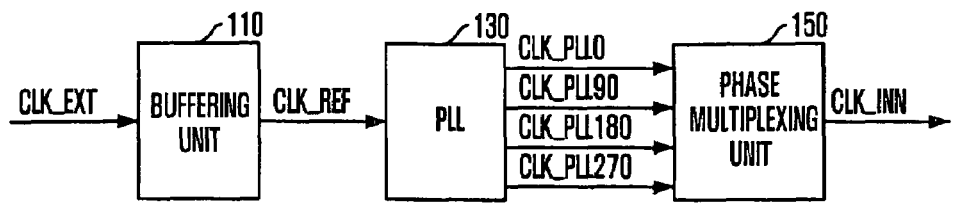
FIG. 1 is a block diagram illustrating a conventional clock synchronizing circuit.
Figure 2:
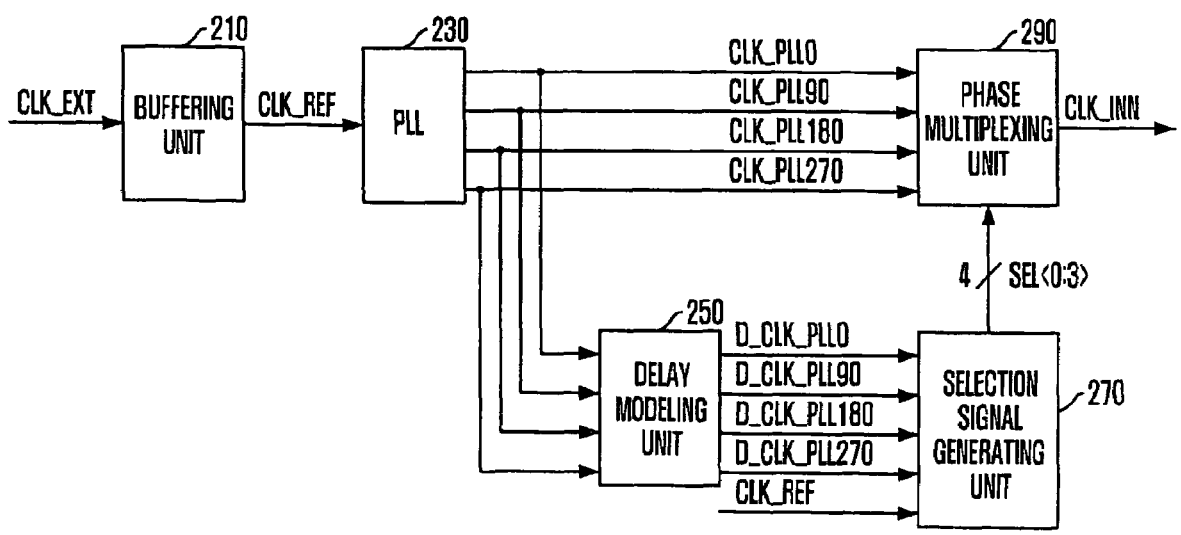
FIG. 2 is a block diagram illustrating a clock synchronizing circuit according to an embodiment of the present invention.

FIG. 2 is a block diagram illustrating a clock synchronizing circuit according to an embodiment of the present invention. The clock synchronizing circuit includes a buffering unit 210, a PLL 230, a delay modeling unit 250, a selection signal generating unit 270, and a phase multiplexing unit 290.

The buffering unit 210 receives and buffers an external clock CLK_EXT to generate a reference clock signal CLK_REF.

The PLL 230 receives the reference clock signal CLK_REF to generate a plurality of CLK_PLL0, CLK_PLL90, CLK_PLL180 and CLK_PLL270. The plurality of clock signals CLK_PLL0, CLK_PLL90, CLK_PLL180 and CLK_PLL270 are signals having a constant phase difference from each other. In more detail, the plurality of clock signals CLK_PLL0, CLK_PLL90, CLK_PLL180 and CLK_PLL270 include a first clock signal CLK_PLL0, a second clock signal CLK_PLL90 having a phase difference of 90° from the first clock signal CLK_PLL0, a third clock signal CLK_PLL180 having a phase difference of 180° from the first clock signal CLK_PLL0, and a fourth clock signal CLK_PLL270 having a phase difference of 270° from the first clock signal CLK_PLL0.

The delay modeling unit 250 generates first to fourth delay clock signals D_CLK_PLL0, D_CLK_PLL90, D_CLK_PLL180 and D_CLK_PLL270 by reflecting a delay time of an actual clock/data path to the first to fourth clock signals CLK_PLL0, CLK_PLL90, CLK_PLL180 and CLK_PLL270. Here, the first delay clock signal D_CLK-PLL0 is a signal which reflects a delay time of an actual clock/data path to the first clock signal CLK-PLL0, the second delay clock signal D_CLK-PLL90 is a signal which reflects the delay time to the second clock signal CLK-PLL90, the third delay clock signal D_CLK-PLL180 is a signal which reflects the delay time to the third clock signal CLK-PLL180, and the fourth delay clock signal D_CLK-PLL270 is a signal which reflects the delay time to the fourth clock signal CLK-PLL270.

The selection signal generating unit 270 generates selection signals SEL<0:3> depending on a phase relationship between the reference clock signal CLK_REF and the first to fourth delay clock signals D_CLK_PLL0, D_CLK_PLL90, D_CLK_PLL180 and D_CLK_PLL270.

The phase multiplexing unit 290 outputs any one of the first to fourth clock signals CLK_PLL0, CLK_PLL90, CLK_PLL180 and CLK_PLL270 as a final clock signal CLK_INN in response to the selection signals SEL<0:3>. This final clock signal CLK_INN becomes an internal clock signal.

The concrete circuit constructions of the buffering unit 210, the PLL 230 and the delay modeling unit 250 are well known to those skilled in the art, and accordingly their detailed descriptions will be omitted. However, the selection signal generating unit 270 and the phase multiplexing unit 290 closely relating to the present invention will be described in more detail.

Figure 3:
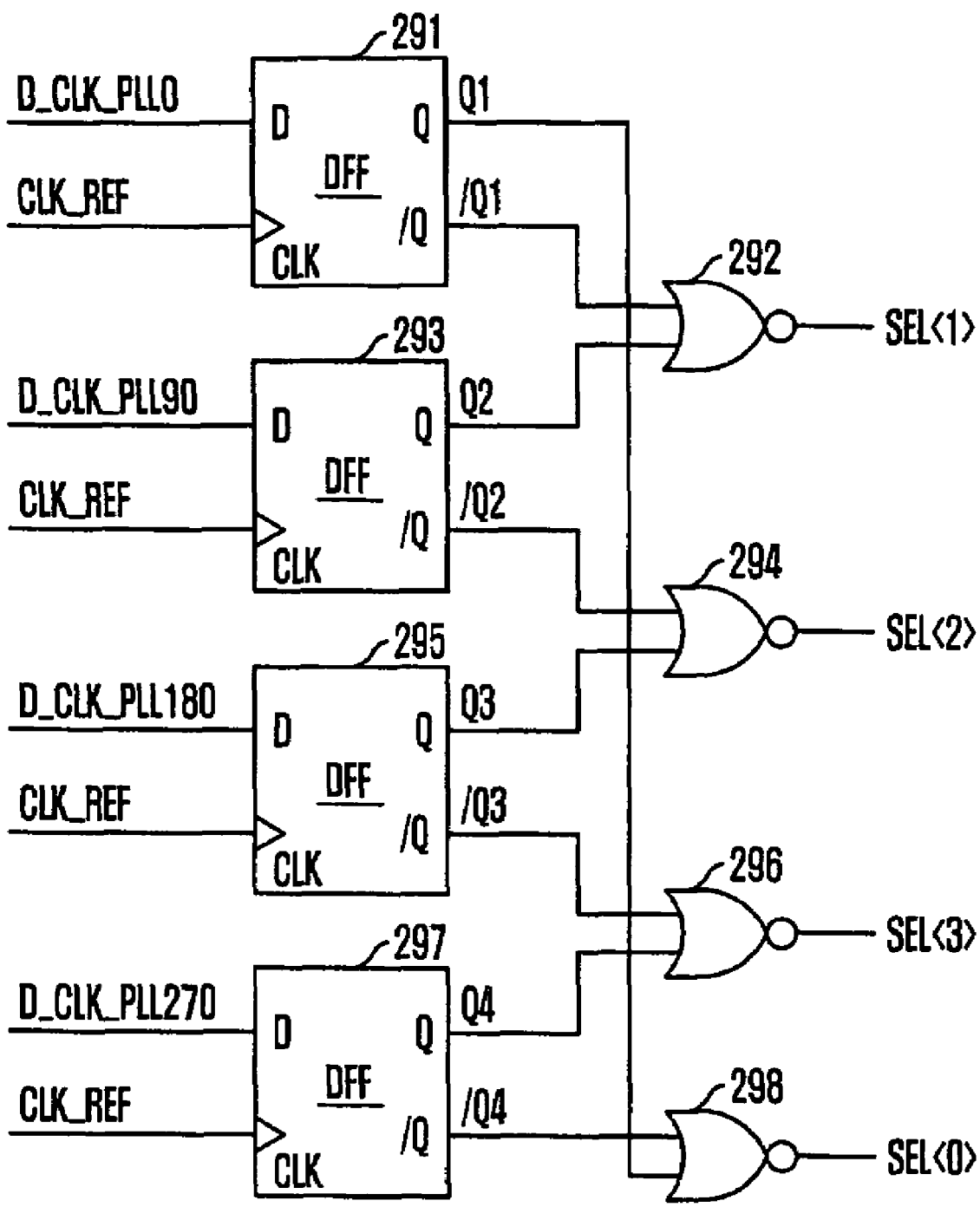
FIG. 3 is a circuit diagram illustrating a selection signal generating unit of FIG. 2.

FIG. 3 is a circuit diagram illustrating the selection signal generating unit 270 of FIG. 2.

Referring to FIG. 3, the selection signal generating unit 270 may include first to fourth phase detecting units 291, 293, 295, 297 and selection signal outputting units 292, 294, 296, 298. The first to fourth phase detecting units 291, 293, 295, 297 detect phases of the first to fourth delay clock signals D_CLK_PLL0, D_CLK_PLL90, D_CLK_PLL180 and D_CLK_PLL270, respectively, in response to the reference clock signal CLK_REF to output a plurality of detection signals Q1, /Q1, Q2, /Q2, Q3, /Q3, Q4, /Q4. The selection signal outputting units 292, 294, 296, 298 output selection signals SEL<0:3> in response to the respective detection signals Q1, /Q1, Q2, /Q2, Q3, /Q3, Q4, /Q4.

The first to fourth phase detecting units 291, 293, 295 and 297 may be comprised of D-flip flops. The first phase detecting unit 291 outputs first positive/negative detection signals Q1 and /Q1 corresponding to the first delay clock signal D_CLK_PLL0 in response to the reference clock signal CLK_REF. The second phase detecting unit 293 outputs second positive/negative detection signals Q2 and /Q2 corresponding to the second delay clock signal D_CLK_PLL90 in response to the reference clock signal CLK_REF. The third phase detecting unit 295 outputs third positive/negative detection signals Q3 and /Q3 corresponding to the third delay clock signal D_CLK_PLL180 in response to the reference clock signal CLK_REF. The fourth phase detecting unit 297 outputs fourth positive/negative detection signals Q4 and /Q4 corresponding to the fourth delay clock signal D_CLK_PLL270 in response to the reference clock signal CLK_REF. Herein, the first positive detection signal Q1 and the first negative detection signal /Q1 have an opposite phase, the second positive detection signal Q2 and the second negative detection signal /Q2 have an opposite phase, the third positive detection signal Q3 and the third negative detection signal /Q3 have an opposite phase, and the fourth positive detection signal Q4 and the fourth negative detection signal /Q4 have an opposite phase.

The first selection signal outputting unit 298 outputs the first selection signal SEL<0> in response to the fourth negative detection signal /Q4 and the first positive detection signal Q1, the second selection signal outputting unit 292 outputs the second selection signal SEL<1> in response to the first negative detection signal /Q1 and the second positive detection signal Q2, the third selection signal outputting unit 294 outputs the third selection signal SEL<2> in response to the second negative detection signal /Q2 and the third positive detection signal Q3, and the fourth selection signal outputting unit 296 outputs the fourth selection signal SEL<3> in response to the third negative detection signal /Q3 and the fourth positive detection signal Q4.

Figure 4:
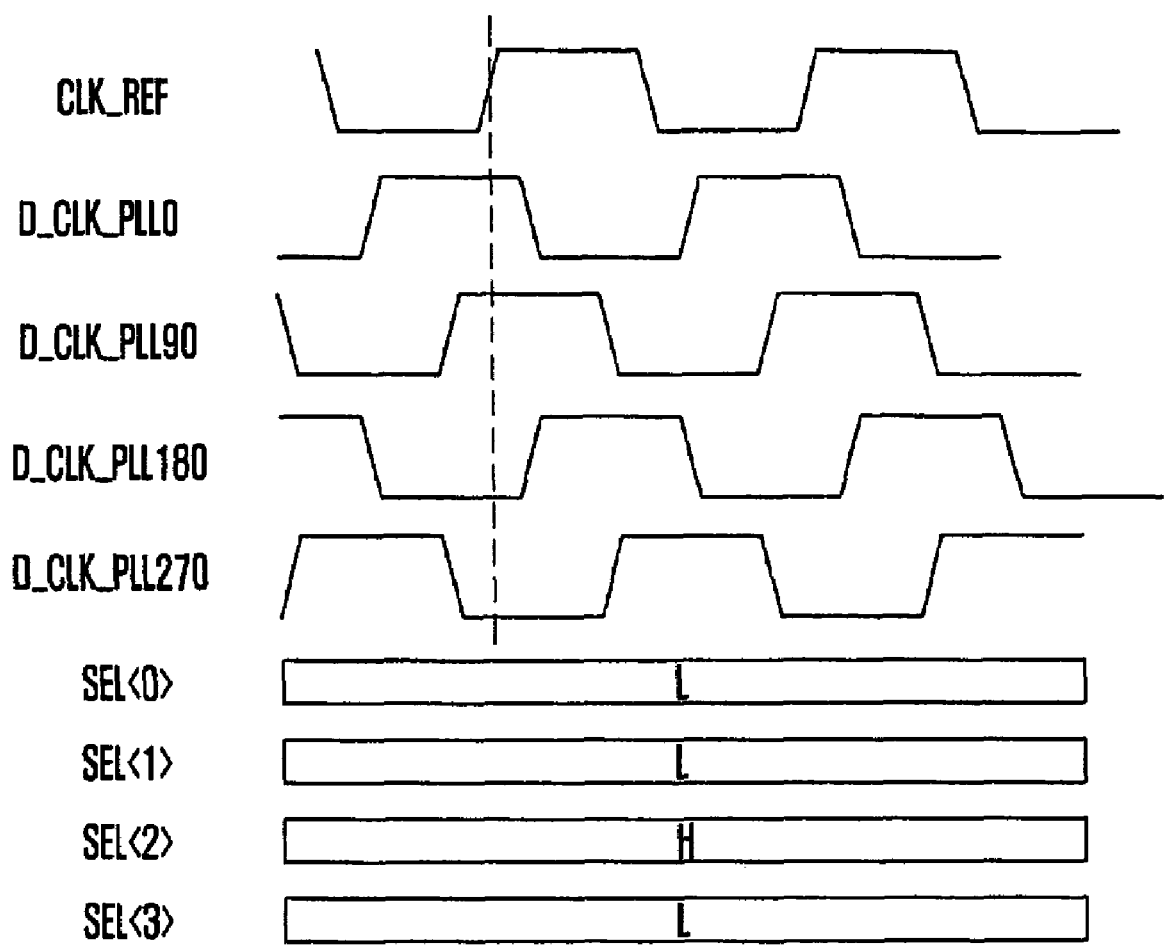
FIG. 4 is a signal timing diagram illustrating selection signals according to a reference clock signal and first to fourth delay clock signals of FIG. 3.

FIG. 4 is a timing diagram illustrating the selection signals SEL<0:3> according to the reference clock signal CLK_REF and the first to fourth delay clock signals D_CLK_PLL0, D_CLK_PLL90, D_CLK_PLL180 and D_CLK_PLL270.

For the convenience of description, it is, for example, assumed that the first to fourth phase detecting units 291, 293, 295 and 297 of FIG. 3 output a signal inputted into an input terminal D at a rising edge of the reference clock signal CLK_REF, and it is also assumed that the third delay clock signal D_CLK_PLL180 is a signal synchronized with the external clock CLK_EXT.

Referring to FIGS. 3 and 4, at the rising edge of the reference clock signal CLK_REF, the first positive detection signal Q1 is a logic 'high' and the first negative detection signal /Q1 is a logic 'low'. The second positive detection signal Q2 is a logic 'high' and the second negative detection signal /Q2 is a logic 'low'. The third positive detection signal Q3 is a logic 'low' and the third negative detection signal /Q3 is a logic 'high'. The fourth positive detection signal Q4 is a logic 'low' and the fourth negative detection signal /Q4 is a logic 'high'.

Accordingly, the first selection signal SEL<0> becomes a logic 'low' by performing a NOR operation of the fourth negative detection signal /Q4 and the first positive detection signal Q1, the second selection signal SEL<1> becomes a logic 'low' by performing a NOR operation of the first negative detection signal /Q1 and the second positive detection signal Q2, the third selection signal SEL<2> becomes a logic 'high' by performing a NOR operation of the second negative detection signal /Q2 and the third positive detection signal Q3, and the fourth selection signal SEL<3> becomes a logic 'low' by performing a NOR operation of the third negative detection signal /Q3 and the fourth positive detection signal Q4. Finally, only the third selection signal SEL<2> becomes a logic 'high'.

The first to fourth selection signals SEL<0:3> are inputted into the phase multiplexing unit 290 of FIG. 2 to select the third clock signal CLK_PLL180 as a final clock signal CLK_INN. The selected third clock signal CLK_PLL180 passes through an actual clock/data path, and data outputted in response to the passes third clock signal CLK_PLL180 may be synchronized with the external clock CLK_EXT.

Figure 5:
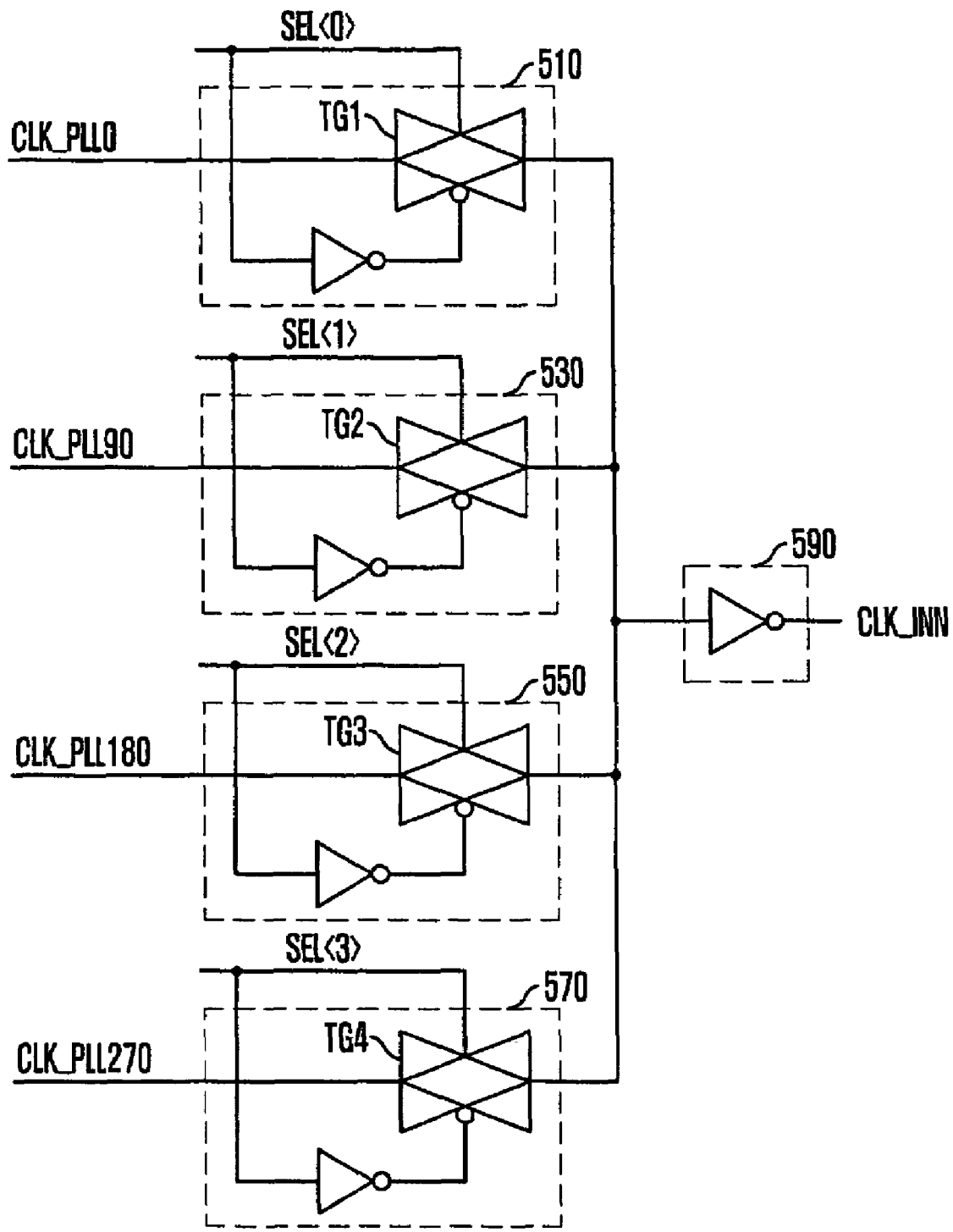
FIG. 5 is a circuit diagram illustrating a phase multiplexing unit of FIG. 2.

FIG. 5 is a circuit diagram illustrating the phase multiplexing unit 290 of FIG. 2.

Referring to FIG. 5, the phase multiplexing unit 290 may include first to fourth transferring units 510, 530, 550 and 570. The first transferring unit 510 transfers the first clock signal CLK_PLL0 as the final clock signal CLK_INN in response to the first selection signal SEL<0>, the second transferring unit 530 transfers the second clock signal CLK_PLL90 as the final clock signal CLK_INN in response to the second selection signal SEL<1>, the third transferring unit 550 transfers the third clock signal CLK_PLL180 as the final clock signal CLK_INN in response to the third selection signal SEL<2>, and the fourth transferring unit 570 transfers the fourth clock signal CLK_PLL270 as the final clock signal CLK_INN in response to the fourth selection signal SEL<3>. The phase multiplexing unit 290 may further include a driving unit 590 for driving output signals of the first to fourth transferring units 510, 530, 550 and 570 as the final clock signals CLK_INN.

The first to fourth transferring units 510, 530, 550 and 570 may include transferring gates TG1, TG2, TG3 and TG4 each comprised of a PMOS transistor and an NMOS transistor, and are turned on or off in response to the first to fourth selection signals SEL<0:3>. For example, if the third selection signal SEL<2> is a logic 'high', the transferring gate TG3 of the third transferring unit 550 is turned on and accordingly, the third clock signal CLK_PLL180 is transferred as the final clock signal CLK_INN.

For reference, if the phase multiplexing unit 290 can transfer a desired clock signal as the final clock signal CLK_INN in response to the selection signals SEL<0:3>, various designs for the phase multiplexing unit 290 will be available according to a designer's intention.

Figure 6:
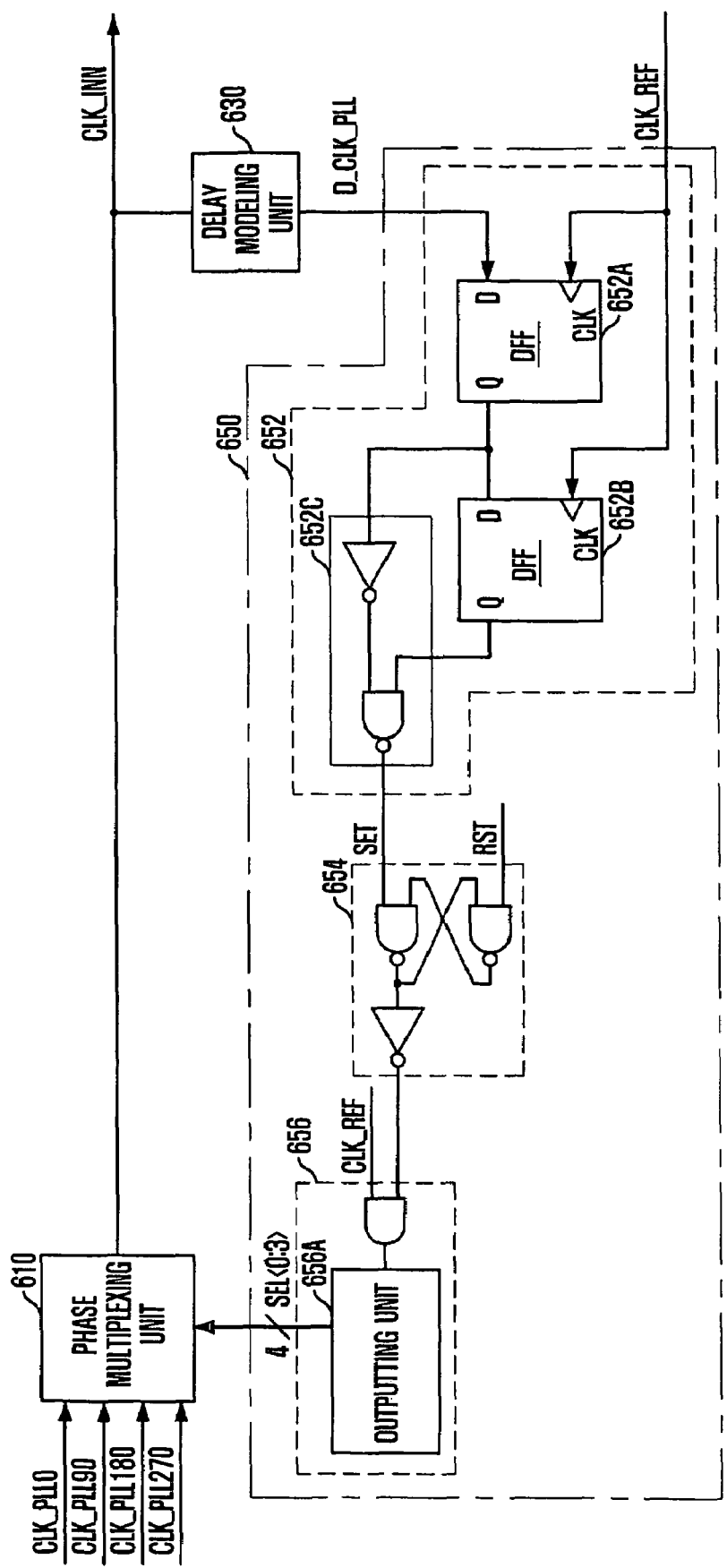
FIG. 6 is a circuit diagram illustrating a clock synchronizing circuit in accordance with another embodiment of the present invention.

FIG. 6 is a circuit diagram illustrating a clock synchronizing circuit in accordance with another embodiment of the present invention.

A phase multiplexing unit 610, a delay modeling unit 630, and a selection signal generating unit 650 are shown in FIG. 6, and for the convenience of description, the PLL 230 (see FIG. 2) generating the first to fourth clock signals CLK_PLL0, CLK_PLL90, CLK_PLL180 and CLK_PLL270 is not shown.

The phase multiplexing unit 610 selects any one of the first to fourth clock signals CLK_PLL0, CLK_PLL90, CLK_PLL180 and CLK_PLL270 in response to the selection signals SEL<0:3>, and outputs the selected one as the final clock signal CLK_INN. Herein, the phase multiplexing unit 610 may have the same construction as that of the first embodiment, or a different construction according to a designer's intention.

Like in the first embodiment, the first to fourth clock signals CLK_PLL0, CLK_PLL90, CLK_PLL180 and CLK_PLL270 are signals having a constant phase difference from each other.

The delay modeling unit 630 generates a delay clock signal D_CLK_PLL by reflecting a delay time of an actual clock/data path to an output clock outputted from the phase multiplexing unit 610. The delay clock signal D_CLK_PLL may vary with the output clock of the phase multiplexing unit 610. In other words, when the first clock signal CLK_PLL0 is outputted from the phase multiplexing unit 610 by the selection signals SEL<0:3>, the delay clock signal D_CLK_PLL becomes a clock signal, which is generated by delaying the first clock signal CLK_PLL0. When the second clock signal CLK_PLL90 is outputted, the delay clock signal D_CLK_PLL becomes a clock signal, which is generated by delaying the second clock signal CLK_PLL90. Likewise, when the third clock signal CLK_PLL180 is outputted, the delay clock signal D_CLK_PLL becomes a clock signal, which is generated by delaying the third clock signal CLK_PLL180, and when the fourth clock signal CLK_PLL270 is outputted, the delay clock signal D_CLK_PLL becomes a clock signal, which is generated by delaying the fourth clock signal CLK_PLL270.

The selection signal generating unit 650 compares the inputted delay clock signal D_CLK_PLL with a previously inputted delay clock signal to generate the selection signals SEL<0:3>. The selection signal generating unit 650 may include a signal comparing unit 652, an activating unit 654, and a selection signal outputting unit 656.

The signal comparing unit 652 compares the inputted delay clock signal D_CLK_PLL with a previously inputted delay clock signal to output a set signal SET. The signal comparing unit 652 may include first and second storing units 652A and 652B, and a set signal outputting unit 652C. The first and second storing units 652A and 652B store the inputted delay clock signal D_CLK_PLL in response to the reference clock signal CLK_REF, and the set signal outputting unit 652C outputs a set signal SET in response to output signals of the first and second storing units 652A and 652B. Herein, the first and second storing units 652A and 652B may include a D flip flop. In this construction, when the previously inputted delay clock signal, i.e., the output of the second storing unit 652B, is a logic 'high' and the inputted delay clock signal D_CLK_PLL, i.e., the output of the first storing unit 652A, is a logic 'low, the set signal SET is activated.

The activating unit 654 activates the selection signal outputting unit 656 in response to the set signal SET and a reset signal RST, and may use a general SR latch.

When the selection signal outputting unit 656 is activated in response to the output signal of the activating unit 654, the selection signal outputting unit 656 outputs the selection signals SEL<0:3> in response to the reference clock signal CLK_REF. The selection signals SEL<0:3> are signals corresponding to the first to fourth clock signals CLK_PLL0, CLK_PLL90, CLK_PLL180 and CLK_PLL270, and signals to sequentially select the first to fourth clock signals CLK_PLL0, CLK_PLL90, CLK_PLL180 and CLK_PLL270.

Operations of the second embodiment will now be described with reference to FIGS. 4 and 6.

For the convenience of description, it is assumed that the first and second storing units 652A and 652B store signals inputted into the input terminal D at the rising edge of the reference clock signal CLK_REF. Also, it is assumed that the desired final clock signal CLK_INN is the third clock signal CLK_PLL180. It is further assumed that the selection signals SEL<0:3> for selecting the first clock signal CLK_PLL0 is '1000', the selection signals SEL<0:3> for selecting the second clock signal CLK_PLL90 is '0100', the selection signals SEL<0:3> for selecting the third clock signal CLK_PLL180 is '0010', and the selection signals SEL<0:3> for selecting the fourth clock signal CLK_PLL270 is '0001'. These selection signals SEL<0:3> may be generated by configuring the outputting unit 656A as a shift register or a counter corresponding to the first to fourth clock signals CLK_PLL0, CLK_PLL90, CLK_PLL180 and CLK_PLL270.

First, when the reset signal RST is activated, the selection signal outputting unit 656 outputs the selection signals SEL<0:3> for selecting the first clock signal CLK_PLL0, i.e. '1000'. The first clock signal CLK_PLL0 is delayed via the delay modeling unit 630, and the delay clock signal D_CLK_PLL corresponding to the first clock signal CLK_PLL0 is stored in the first storing unit 652A. That is, a logic 'high' is stored in the first storing unit 652A. Next, the selection signals SEL<0:3> becomes '0100' in response to the reference clock signal CLK_REF, and accordingly, the phase multiplexing unit 610 outputs the second clock signal CLK_PLL90. At this time, the second storing unit 652B stores an output signal of the first storing unit 652A, and the first storing unit 652A stores the delay clock signal D_CLK_PLL corresponding to the second clock signal CLK_PLL90. That is, a logic 'high' is stored in the first and second storing units 652A and 652B. Up to now, the set signal SET is not activated.

Next, the selection signals SEL<0:3> becomes '0010' in response to the next reference clock signal CLK_REF, and accordingly, the phase multiplexing unit 610 outputs the third clock signal CLK_PLL180. At this time, the second storing unit 652B stores a logic 'high' of the first storing unit 652A, and the first storing unit 652A stores the delay clock signal D_CLK_PLL corresponding to the third clock signal CLK_PLL180. That is, a logic 'low' is stored in the second storing unit 652B. At this time, if the set signal is activated, the selection signal outputting unit 656 outputs the selection signals SEL<0:3> fixed to '0010', so that the third clock signal CLK_PLL180 is outputted as the final clock signal CLK_INN.

Meanwhile, when the reset signal is activated, the selection signal outputting unit 656 is activated to output a desired one of the first to fourth clock signals CLK_PLL0, CLK_PLL90, CLK_PLL180 and CLK_PLL270 as the final clock signal CLK_INN in the manner described above.

As described above, in the present invention, a plurality of delay clock signals are generated by reflecting a delay time of an actual clock/data path to the first to fourth clock signals CLK_PLL0, CLK_PLL90, CLK_PLL180 and CLK_PLL270. Selection signals SEL<0:3> are generated according to a phase relationship of the plurality of delay clock signals. Any one of the first to fourth clock signals CLK_PLL0, CLK_PLL90, CLK_PLL180 and CLK_PLL270 may be outputted as a final clock signal using the selection signals SEL<0:3>. The final clock signal CLK_INN selected as above passes through an actual clock/data path, and when data is outputted in response to the passing final clock signal CLK_INN, the data can be finally synchronized with the external clock CLK_EXT. By doing this, a locking range of a clock and data recovery (CDR) circuit can be reduced. Also, a circuit operated at a low frequency can be operated without the CDR circuit.

According to the above-described present invention, since a desired internal clock can be generated without a phase mixing unit or a DLL, a layout burden in designing such a circuit can be reduced. Also, since the internal clock is generated with a minimal delay time, a faster operation can be guaranteed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a multiclock signal generating unit configured to receive a reference clock signal and generate a plurality of clock signals having a constant phase difference from each other;
   a delay modeling unit configured to generate a plurality of delay clock signals by delaying the plurality of clock signals;
   a selection signal generating unit configured to generate selection signals by comparing phases between the reference clock signal and the plurality of delay clock signals; and
   a phase multiplexing unit configured to output any one of the plurality of clock signals as a final clock signal in response to the selection signals.

2. The semiconductor memory device as recited in claim 1, wherein the selection signal generating unit includes:
   a phase detecting unit configured to detect a phase of each of the plurality of delay clock signals in response to the reference clock signal and output the detected phases as a plurality of detection signals; and
   a selection signal outputting unit configured to output the selection signals by combining the plurality of detection signals.

3. The semiconductor memory device as recited in claim 2, wherein the plurality of clock signals are consecutively separated by phase differences of 90°.

4. The semiconductor memory device as recited in claim 3, wherein the plurality of delay clock signals include first to fourth delay clock signals respectively corresponding to first to fourth clock signals of the plurality of clock signals.

5. The semiconductor memory device as recited in claim 4, wherein the phase detecting unit includes:
   a first phase detecting unit configured to output a first detection signal corresponding to the first delay clock signal in response to the reference clock signal;
   a second phase detecting unit configured to output a second detection signal corresponding to the second delay clock signal in response to the reference clock signal;
   a third phase detecting unit configured to output a third detection signal corresponding to the third delay clock signal in response to the reference clock signal; and a fourth phase detecting unit configured to output a fourth detection signal corresponding to the fourth delay clock signal in response to the reference clock signal.

6. The semiconductor memory device as recited in claim 5, wherein the first detection signal includes a first positive detection signal and a first negative detection signal having an opposite phase to the first positive detection signal, the second detection signal includes a second positive detection signal and a second negative detection signal having an opposite phase to the second positive detection signal, the third detection signal includes a third positive detection signal and a third negative detection signal having an opposite phase to the third positive detection signal, and the fourth detection signal includes a fourth positive detection signal and a fourth negative detection signal having an opposite phase to the fourth positive detection signal.

7. The semiconductor memory device as recited in claim 5, wherein the first to fourth phase detecting units includes a flip flop configured to output the corresponding detection signal in response to the reference clock signal.

8. The semiconductor memory device as recited in claim 6, wherein the selection signal outputting unit includes:
a first outputting unit configured to output a first selection signal by combining the fourth negative detection signal and the first positive detection signal;
a second outputting unit configured to output a second selection signal by combining the first negative detection signal and the second positive detection signal;
a third outputting unit configured to output a third selection signal by combining the second negative detection signal and the third positive detection signal; and
a fourth outputting unit configured to output a fourth selection signal by combining the third negative detection signal and the fourth positive detection signal.

9. The semiconductor memory device as recited in claim 8, wherein the phase multiplexing unit includes:
a first transferring unit configured to transfer the first clock signal as the final clock signal in response to the first selection signal;
a second transferring unit configured to transfer the second clock signal as the final clock signal in response to the second selection signal;
a third transferring unit configured to transfer the third clock signal as the final clock signal in response to the third selection signal; and
a fourth transferring unit configured to transfer the fourth clock signal as the final clock signal in response to the fourth selection signal.

10. The semiconductor memory device as recited in claim 9, further including a driving unit configured to drive an output signal of phase multiplexing unit and output the driven output signal as the final clock signal.

11. The semiconductor memory device as recited in claim 1, wherein the multiclock generating unit includes a phase locked loop.

12. The semiconductor memory device as recited in claim 1, wherein the delay modeling unit configured to generate the plurality of delay clock signals by reflecting a delay time of an actual clock/data path to the plurality of clock signals.

13. A semiconductor memory device, comprising:
a multiclock signal generating unit configured to receive a reference clock signal and generate a plurality of clock signals having a constant phase difference from each other;
a phase multiplexing unit configured to select any one of the plurality of clock signals in response to selection signals and output the selected clock signal as a final clock signal;
a delay modeling unit configured to generate a delay clock signal by delaying the final clock signal; and
a selection signal generating unit configured to compare the delay clock signal with a previous delay clock signal and generate the selection signals.

14. The semiconductor memory device as recited in claim 13, wherein the selection signal generating unit includes:
a selection signal outputting unit configured to output the selection signals in response to the reference clock signal;
a signal comparing unit configured to compare the delay clock signal with the previous delay clock signal and output a set signal; and
an activating unit configured to activate the selection signal outputting unit in response to the set signal and a reset signal.

15. The semiconductor memory device as recited in claim 14, wherein the selection signal outputting unit includes a shift register.

16. The semiconductor memory device as recited in claim 14, wherein the selection signal outputting unit includes a counter corresponding to the plurality of clock signals.

17. The semiconductor memory device as recited in claim 14, wherein the selection signals sequentially correspond to the plurality of clock signals in response to the reference clock signal.

18. The semiconductor memory device as recited in claim 14, wherein the signal comparing unit includes:
a first storing unit configured to store the delay clock signal in response to the reference clock signal;
a second storing unit configured to store an output of the first storing unit in response to the reference clock signal; and
an outputting unit configured to output the set signal in response to output signals of the first and second storing units.

19. The semiconductor memory device as recited in claim 13, wherein the plurality of clock signals include first to fourth clock signals consecutively separated by phase differences of 90°.

20. The semiconductor memory device as recited in claim 19, wherein the selection signals includes first to fourth selection signals corresponding to the first to fourth clock signals.

21. The semiconductor memory device as recited in claim 20, wherein the phase multiplexing unit includes:
a first transferring unit configured to transfer the first clock signal as the final clock signal in response to the first selection signal;
a second transferring unit configured to transfer the second clock signal as the final clock signal in response to the second selection signal;
a third transferring unit configured to transfer the third clock signal as the final clock signal in response to the third selection signal; and
a fourth transferring unit configured to transfer the fourth clock signal as the final clock signal in response to the fourth selection signal.

22. The semiconductor memory device as recited in claim 13, wherein the multiclock generating unit includes a phase locked loop.

23. The semiconductor memory device as recited in claim 13, wherein the delay modeling unit configured to generate the plurality of delay clock signals by reflecting a delay time of an actual clock/data path to the final clock signal.

24. A semiconductor memory device, comprising:

a multiclock signal generating unit configured to receive a reference clock signal and generate a plurality of clock signals having a constant phase difference from each other; and a phase multiplexing unit configured to generate selection signals according to a phase relationship between a reference clock signal and a plurality of delay clock signals, which are generated by reflecting a delay time of an actual clock/data path to the plurality of clock signals, and output any one of the plurality of clock signals as a final clock signal in response to the selection signals.

25. The semiconductor memory device as recited in claim 24, wherein the plurality of clock signals includes first to fourth clock signals consecutively separated by phase differences of 90°.

26. The semiconductor memory device as recited in claim 24, wherein the multiclock generating unit includes a phase locked loop.

\* \* \* \* \*